United States Patent
Hackett

Patent Number: 5,368,634
Date of Patent: Nov. 29, 1994

[54] REMOVING BUBBLES FROM SMALL CAVITIES

[75] Inventor: Le Roy H. Hackett, Woodland Hills, Calif.

[73] Assignee: Hughes Aircraft Company, Los Angeles, Calif.

[21] Appl. No.: 98,482

[22] Filed: Jul. 26, 1993

[51] Int. Cl.$^5$ ............................................. B06B 1/10
[52] U.S. Cl. ........................................ 95/260; 205/88; 205/205; 95/266; 427/299; 427/444; 134/22.12
[58] Field of Search ................... 134/1, 22.12; 205/88; 95/260, 262, 266; 427/299, 444

[56] References Cited
FOREIGN PATENT DOCUMENTS
165361  6/1992  Japan .

Primary Examiner—John Niebling
Assistant Examiner—Edna Wong
Attorney, Agent, or Firm—V. D. Duraiswamy; W. K. Denson-Low

[57] ABSTRACT

Bubbles are removed from small cavities, such as blind via holes in a semiconductor wafer, by immersing the article having the cavities in a liquid medium. A wetting agent is preferably present in the liquid medium. A vacuum is applied to the liquid medium, and the vacuum is vented to air. The application of vacuum and venting are repeated several times, causing the bubbles to be drawn from the cavities and to dislodge from the surface of the article. The bubbles float free, and processing within the cavities can commence.

10 Claims, 3 Drawing Sheets

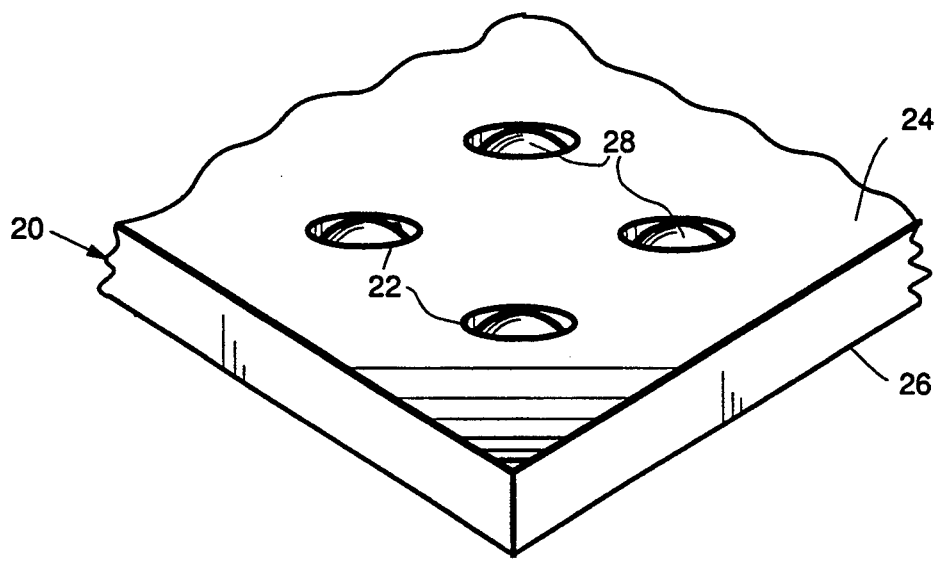
FIG. 1.
FIG. 2.
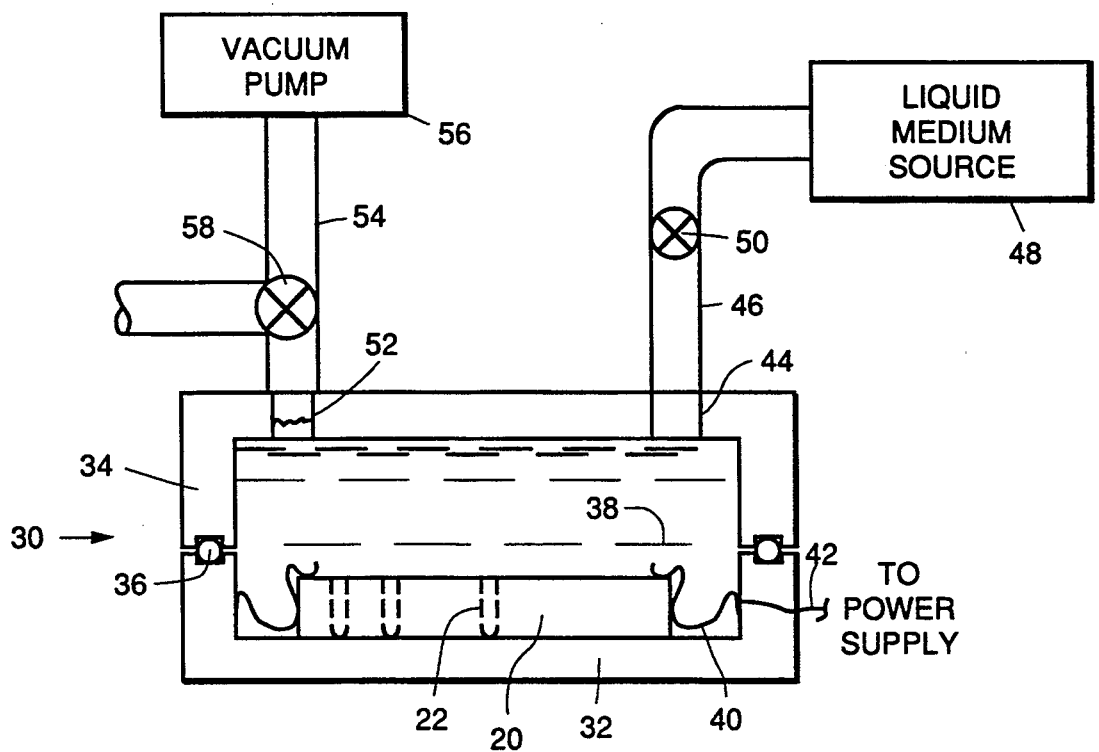

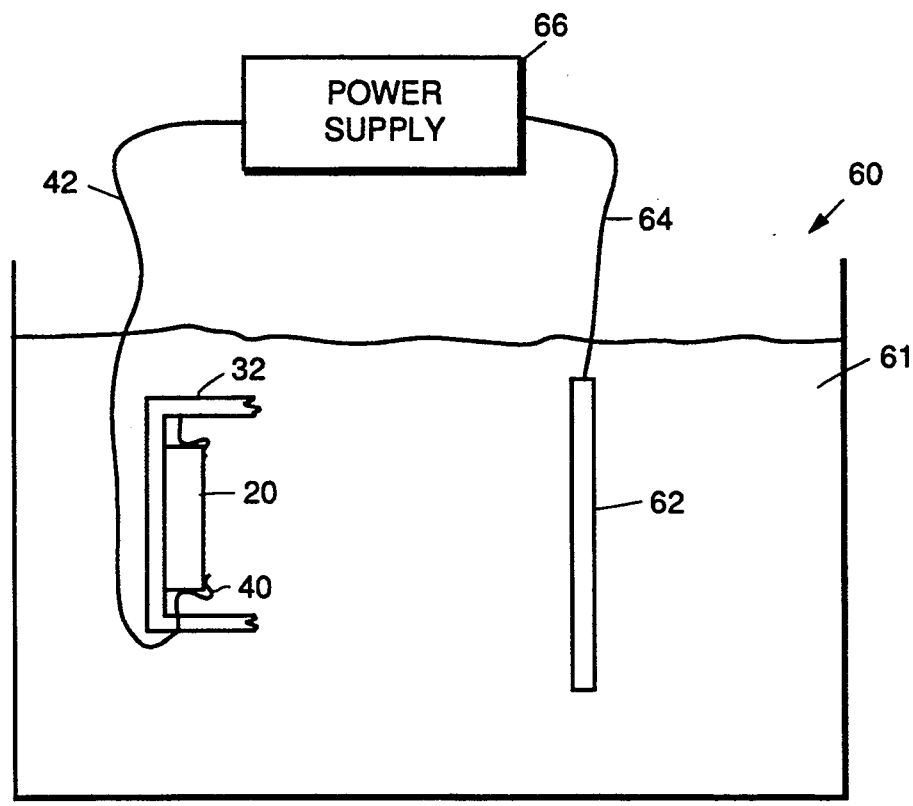
FIG. 3.
FIG. 5.
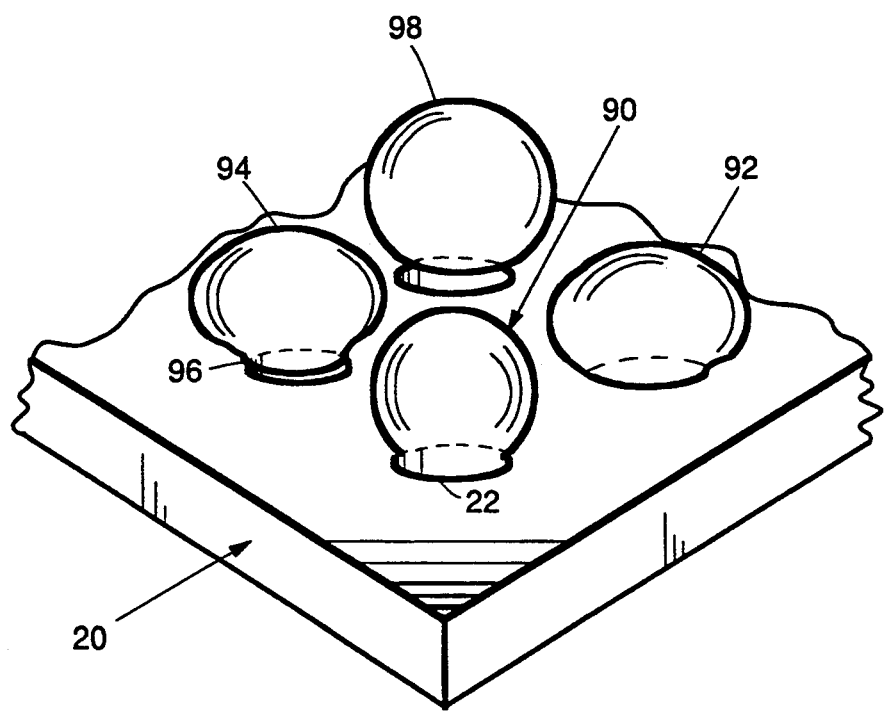

REMOVING BUBBLES FROM SMALL CAVITIES

BACKGROUND OF THE INVENTION

This invention relates to the processing of articles that may contain cavities therein, and, more particularly, to the removing of bubbles from such cavities to permit processing of the interiors of the cavities.

During the manufacture of microelectronic devices, it is sometimes necessary to establish an electrically conductive path from a back side of a semiconductor wafer to a device structure on the front side of the wafer. One approach to producing such a conductive path is to form a small cavity or hole, termed a "via" in the art, through the wafer from the back side to the device structure on the front side. The interior of the via is electroplated with a layer of all electrically conductive material to form an annular conductive path or, alternatively, the entire volume of the via may be filled with a metallic conductor.

There are several techniques for forming the via through the wafer, such as patterning and wet etching, patterning and dry etching, laser etching, and the like. To electroplate an electrically conductive layer into the via, those parts of the wafer that are not to be electroplated are protected by a mask. The masked wafer is immersed into an electroplating solution. With the wafer made the cathode of an electroplating cell, ions of the conductive material are plated onto the walls of the vias from the electroplating solution.

If the vias are very small in diameter, air bubbles may remain in the vias when the wafer is immersed into the electroplating solution. The smaller the vias in diameter and the longer their lengths relative to their diameters, the more likely that bubbles remain in the vias after immersion. If the vias are blind holes that end in obstacles at their bottoms, as is often the case, it is even more difficult to remove the bubbles. For example, in a case wherein blind vias are about 10-30 micrometers in diameter and about 100 micrometers long, it is estimated from observation that as many as one-half of the vias retain air bubbles therein upon immersion into an acidic aqueous electroplating solution.

It is necessary to remove the bubbles from the vias prior to electroplating. If a bubble remains in a via, the electroplating solution never reaches the interior of the via, the via wall is not plated with a conductor, and the required conductive path from the back side to the front side of the wafer is never completed. The microelectronic device may consequently be inoperable.

There is a need for a highly reliable technique for removing bubbles from the interiors of vias and other types of cavities during processing. The approach must be operable for large numbers of vias of small diameters. The larger the diameter of the via, the easier it is to remove bubbles. On the other hand, the larger the diameter of the via, the less efficient is the space utilization of the microelectronic device.

The present invention fulfills the need for such a technique for removing bubbles from vias of small diameter, and further provides related advantages.

SUMMARY OF THE INVENTION

The present invention provides a method for removing bubbles from cavities of small diameter. It has a high reliability and success rate for removing the bubbles from large numbers of cavities, including blind-ended cavities. The approach is fully compatible with other manufacturing operations. In particular, the present approach is compatible with the electroplating of vias in microelectronic devices.

In accordance with the invention, a method for removing gases from small cavities in an article comprises the steps of providing an article with a cavity in a surface thereof, providing a liquid medium, and covering the surface of the article with the liquid medium. The method further includes drawing a vacuum on the liquid medium and applying a mechanical impulse to the article.

The mechanical impulse is preferably applied by rapidly venting the vacuum to air, so that the change in pressure over the liquid medium is propagated to the cavities to encourage the bubbles to grow and eventually to float free of the article. The steps of applying a vacuum and venting are preferably repeated in sequence through at least several cycles, with the bubbles growing and becoming less firmly attached to the surface of the article with each cycle. Disassociation of the bubbles from the solid is also encouraged by the adding of a wetting agent to the liquid medium. The wetting agent reduces the surface tension of the bubbles, a major obstacle to bubble release.

A further desirable result of the application of a vacuum is that gases entrapped or dissolved in the liquid medium can migrate to the bubbles as they grow below the surface of the liquid. The liquid medium is thereby degassed, and at vacuum in each cycle the bubbles are progressively enlarged.

The preferred approach of the invention, involving cyclic application of vacuum and venting to atmosphere, does not require special equipment for applying the mechanical impulse. The vacuum is preferably a standard laboratory vacuum available from a mechanical forepump. This vacuum can readily be provided to a sealed cell which contains the article to be degassed. It is not necessary to provide special mechanical vibrators or ultrasonic equipment, although the invention in other embodiments can employ these alternative approaches.

The present invention provides an advance in the art of fabrication technology, particularly in regard to the processing of the interior of blind vias. Other features and advantages of the present invention will be apparent from the following more detailed description of the preferred embodiment, taken in conjunction with the accompanying drawings, which illustrate, by way of example, the principles of the invention.

BRIEF DESCRIPTION OF THE DRAWINGS

FIG. 1 is a perspective view of an article having cavities therein, with bubbles trapped in the cavities;

FIG. 2 is a schematic view of an apparatus for removing the trapped bubbles from the article;

FIG. 3 is a schematic view of an electroplating apparatus;

FIG. 5 is a perspective view of the article of FIG. 1, showing the progressive stages of the removal of bubbles from the interiors of the cavities.

DETAILED DESCRIPTION OF THE INVENTION

Figure 4:
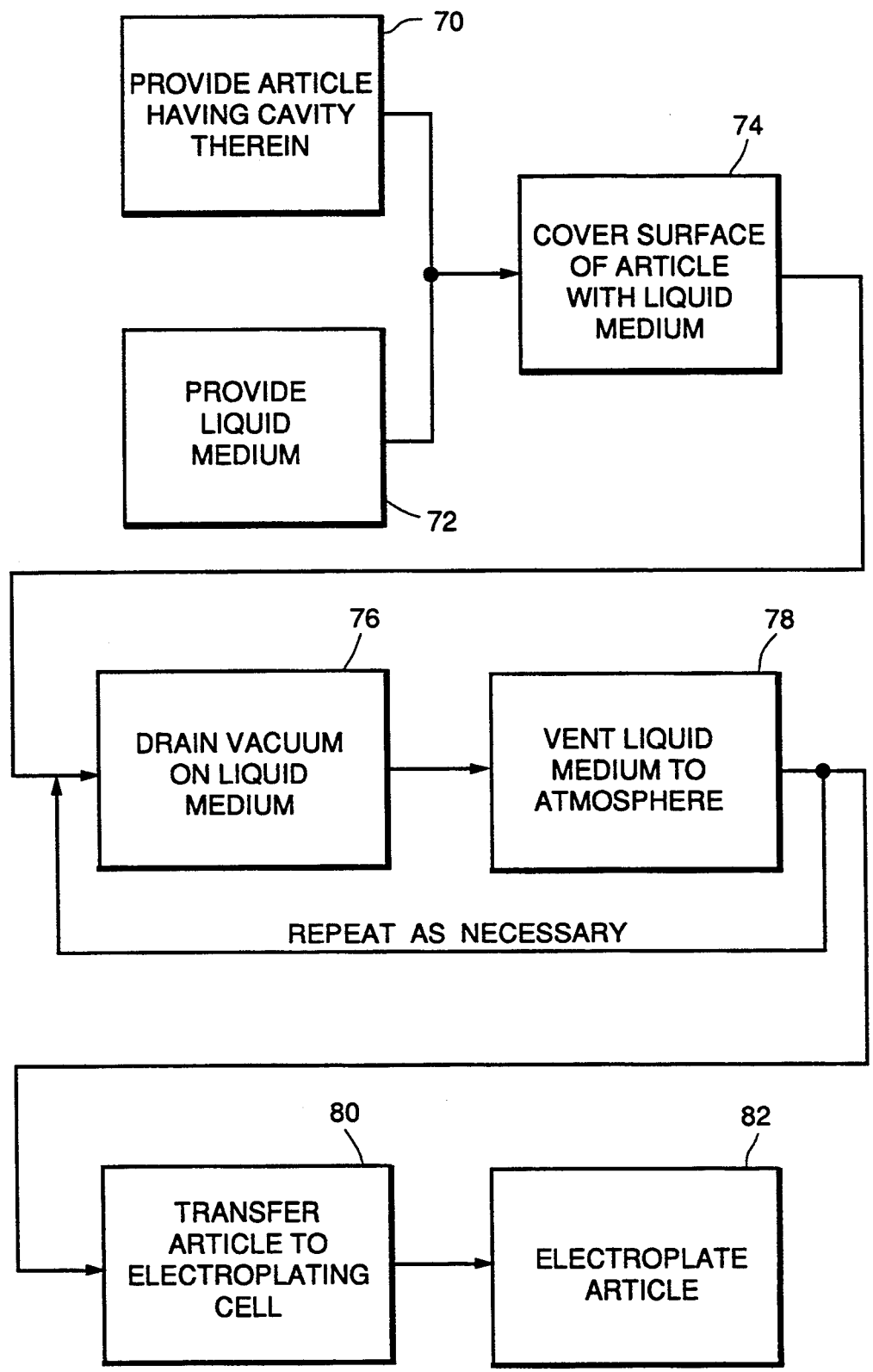
FIG. 4 is a process flow diagram for practicing a preferred embodiment of the invention.

FIG. 1 is a view of an article 20 in the form of a thin plate. The article 20 includes four cavities 22 extending into the article from an exposed face 24. These cavities 22 are blind-ended cavities, which do not extend through the entire thickness of the article 20 to an opposite face 26 that is out of sight in the view of FIG. 1.

In a situation of practical interest, the article 20 is a thin wafer with a microelectronic device structure (not visible) deposited on the opposite face 26 (which would be described as the "front side" of the wafer in microelectronic terminology). The vias/cavities 22 are generally cylindrical, blind holes extending from the exposed face 24 (which would be described as the "back side" of the wafer in microelectronic terminology) to the underside of the microelectronic device structure. The vias are present to allow back side electrical connections to the microelectronic device structure. As such, the inside cylindrical surfaces must be covered with a continuous layer of an electrical conductor, in the preferred case by electroplating. In a typical situation, the vias would be about 10–30 micrometers in diameter and about 100 micrometers long. Four vias are shown in FIG. 1, but in a practical wafer there may be several thousand vias.

When the article 20 is immersed into an electroplating solution or other type of liquid medium, in many cases there are bubbles of air 28 within the cavities 22 that do not float free but instead remain within the cavities 22. Observations of vias of the size indicated above reveal that as many as one-half of the vias retain air bubbles when immersed in an aqueous solution. If the cavities 22 were through-holes accessible on both ends, removal of air bubbles would be much simpler, since a jet of the liquid medium at one side of the wafer can sometimes be successfully used to force the bubbles out of the opposite ends of the cavities. Directing a jet of liquid at the exposed face 24 is not generally successful in causing the removal of the bubbles 28 from a blind cavity.

FIG. 2 is a cell 30 that is used to perform bubble removal from the article 20 prior to electroplating. The cell 30 includes a bottom piece 32 and a mating top piece 34 that are sealed with an O-ring 36, and which together form a sealed chamber 38. The bottom piece 32 is made from polypropylene and the top piece 34 is made of a transparent plastic such as plexiglass. The article 20 is received in the bottom piece 32 and held in place with top retainer clips 40. Before it is placed into the cell 30, the article 20 is masked using conventional masking techniques so that those regions not to be electroplated are not exposed. The retainer clips 40 are made of an electrically conducting metal such as copper.

The top piece 34 includes two feed-throughs. A liquid medium feed-through 44 communicates between the sealed chamber 38 containing the article 20 and a liquid medium conduit 46 that extends to a liquid medium source 48. The liquid medium source 48 contains a supply of the liquid that is to fill the sealed chamber 38, in this case a reactive fluid such as an electroplating solution. A liquid medium valve 50 in the conduit 46 allows the liquid to be controllably introduced into the sealed chamber 38.

The liquid medium desirable includes a wetting agent in addition to its other components. The wetting agent aids in the release of the bubbles from the rim of the cavity, once the bubbles are displaced by their size, by reducing the surface energy of the bubbles and thence one barrier to their release. Many wetting agents are known in the art and are commercially available. The preferred wetting agent is preferably Technics, Inc. S-1 Wetting Agent in a concentration of about 5 milliliters per gallon. The S-1 Wetting Agent has as a principal component the ethoxylated acetylenic diol family of wetting agents.

Any operable electrolyte to deposit the desired material can be used, and a typical electrolyte is a gold-containing aqueous solution such as Technics Cyanide Gold 25. The liquid medium could be some liquid other than an electroplating solution. In the present case the use of the electroplating solution used in the subsequent processing is preferred to avoid contamination and to ensure that electroplating solution penetrates into the cavities.

A vacuum feed-through 52 communicates between the sealed chamber 38 and a vacuum conduit 54 that extends to a vacuum pump 56. The vacuum pump 56 is preferably a mechanical fore-pump that produces a vacuum of about 100 micrometers, and is preferably not a diffusion pump or other type of high-vacuum pump. A valve 58 in the conduit 54 allows the sealed chamber 38 to be controllably evacuated by the vacuum pump 56 and thereafter to be controllably vented to the atmosphere in a series of cycles. The valve 58 is preferably an electromechanical, solenoid-actuated valve that can be cycled under electrical control in a manner to be described subsequently.

The removal of bubbles is accomplished using the cell 30. After the bubbles have been removed from the article 20, electroplating is accomplished in a separate electroplating cell 60, shown in FIG. 3. The electroplating cell 60 utilizes the same bottom piece 32 with the article 20 held in place by the retainer clips 40. The bottom piece 32 and the retained article 20 are immersed in an electrolyte 61 that is contained within the cell 60. A metallic anode 62 is supported in the electrolyte 61. An electrical lead 42 extends from the article 20 (which is the cathode of the cell) and an electrical lead 64 extends from the anode 62 to the opposite poles of an electroplating power supply 66. During electroplating, the power supply 66 applies a negative voltage to the anode 62 relative to the article 20 cathode.

FIG. 4 illustrates the method of removing bubbles 28 from the cavities 22 and electroplating the article. This method is preferably practiced with devices such as the cells 30 and 60, but is not so limited and may be practiced with other types of devices. FIG. 5, taken together with FIG. 1, shows several stages in the bubble removal.

Referring to FIG. 4, the article 20 having the cavities 22 therein is provided (numeral 70). The liquid medium is provided (numeral 72). The article 20 is covered with the liquid medium (numeral 74). In the preferred cell 30, this article 20 is placed into the bottom piece 32 and held in place with the retainer clips 40. The O-ring 36 is positioned, and the top piece 34 is clamped to the bottom piece 32. The liquid medium is introduced into the sealed chamber 38 by opening the valve 50.

When the liquid medium covers the article 20, most of the gas is displaced from the article, but in many cases the bubbles 28 remain in at least some of the cavities 22. The bubbles 28 can be extracted from the cavities 22 and released from their contact with the article 20 so that they float to the surface of the liquid medium.

The bubbles are Initially retained within the cavities 22, as shown at numeral 90 in FIG. 5. To remove the bubbles, the valve 58 is first positioned to draw a vacuum on the liquid medium within the sealed chamber 38 (numeral 76). The vacuum reduces the pressure within the liquid medium, causing the bubbles to expand as indicated at numeral 92 of FIG. 5, while still being largely within the cavities 22. In some cases, the bubbles spontaneously disengage from the article 20 and float upwardly. In most cases, however, it is observed that the bubbles do not disengage with the first vacuum application. Instead, it is necessary to apply a mechanical impulse to the bubbles and the article. The mechanical impulse can be readily applied by any suitable approach, such as, for example, tapping on the cell or an ultrasonic wave applied to the cell and/or the article. Instead, a preferred approach to applying a mechanical impulse is to quickly vent to air the sealed chamber 38 and the liquid medium therein by operating the valve 58 to isolate the vacuum pump 56 and simultaneously venting the cabinet 38 to air (numeral 78). The mechanical movement of the pressure change associated with the venting to atmosphere encourages the separation of the bubbles from the article 20. In some cases, a single cycle of vacuum application 76 and venting 78 may be successful in removing the bubbles from the cavities.

In most cases, however, multiple cycles of vacuum application 75 and venting 78 are required, as indicated by the "Repeat as Necessary" path of FIG. 4. With repeated cycling of the vacuum and venting, bubbles expand and grow. The bubbles tend to gain volume and emerge from the cavities 22 (numeral 94 of FIG. 5). In many cases, they adhere temporarily to the lips of their respective cavities, as indicated at numeral 96. Eventually the combination of the cycles of vacuum and mechanical impulse, and the buoyancy of the bubble causes the bubble to break free of the article 20 and float upwardly (numeral 98 of FIG. 5).

In the reduction to practice of the invention, each vacuum application lasted about 30 seconds and each venting lasted about 2 seconds. The article was periodically observed through the cell walls to determine whether bubbles remained, but the cell 30 was not opened. In a typical case involving a semiconductor wafer having several thousand blind vias of the size indicated previously, it was observed that about 20 cycles of vacuum/venting were sufficient to free all of the bubbles from the vias.

Although the principal objective of the method is to remove bubbles from the interiors of the cavities, a further benefit is the degassing of the liquid medium. Entrained gas bubbles and/or dissolved gas in the liquid medium diffuse to the bubbles in and adjacent to the cavities as they are growing under the influence of the vacuum/venting cycles. Much of this gas content would not otherwise be removed from the liquid medium even with the application of a vacuum to the liquid medium, because of the energy barrier to the nucleation of sufficiently large bubbles in the liquid medium. However, the gas in the liquid medium can diffuse or flow to the already-existing bubbles at the cavities which have no bubble nucleation barrier.

After the bubbles have been removed from the interiors of the cavities by the repeated vacuum/venting cycles, as determined by visual observation, the further processing such as electroplating is conducted. Referring to FIG. 4, the article 20 is transferred to the electroplating cell 60 (numeral 80). To accomplish this transfer, the top piece 34 is removed, and the bottom piece 32, with the article 20 retained therein by the retainer clips 40, is placed into the electroplating cell 60. The lead 42 is connected to the power supply 66, and electroplating is accomplished according to any operable technique (numeral 82). As the transfer of the bottom piece 32 with retained article 20 to the cell 60 is accomplished, care is taken to keep the article 20 submerged below the surface of the solution previously provided in the cell 30. If the article 20 is exposed to air, a new set of bubbles could be introduced into the cavities.

The presently preferred embodiment has been practiced in conjunction with a semiconductor wafer article used in a microelectronic device. The approach of the invention is equally applicable in other contexts where bubbles must be removed from small cavities. Examples include fine meshes, sintered articles with interconnected, open-cell porosity, and porous inlays. The approach is particularly useful in removing bubbles from blind-ended cavities and holes, but can also be used with through-thickness cavities and holes.

Although a particular embodiment of the invention has been described in detail for purposes of illustration, various modifications may be made without departing from the spirit and scope of the invention, and such modifications are within the scope of the invention as defined by the appended claims.

What is claimed is:

1. A method for removing bubbles formed in small cavities in an article when the article is covered with a liquid medium, comprising the steps of:
   providing the article with a cavity in a surface thereof;
   covering the surface of the article with the liquid medium, wherein said liquid medium is an aqueous liquid medium;
   drawing a vacuum on the liquid medium so that gas in the liquid medium diffuses into the bubbles in the cavity and causes the bubbles to grow and become displaced from the cavity; and
   venting the vacuum to atmosphere to make the bubbles disengage from the article and float upwardly.

2. The method of claim 1, further including the additional step of
   repeating the steps of drawing a vacuum and venting, in sequence, at least one additional time.

3. The method of claim 1, wherein the step of providing an article includes the step of
   providing a blind cavity in the surface of the article.

4. The method of claim 1, wherein the step of providing an article includes the step of
   providing an article having a via with a diameter of from about 10 to about 30 micrometers.

5. The method of claim 1, wherein the step of covering the surface of the article with the liquid medium includes the step of
   adding a wetting agent to the liquid medium.

6. The method of claim 1, wherein the step of covering the surface of the article with the liquid medium includes the step of
   providing an aqueous liquid.

7. The method of claim 1, wherein the step of providing an article includes the step of
   providing a microelectronic device having a via therein.

8. The method of claim 1, wherein the step of providing an article includes the step of
   providing a porous material.

9. A method for removing gases from small cavities in an article, comprising the steps of:
   providing a microelectronic device with a blind via in a surface thereof;

providing an aqueous liquid electroplating solution having a wetting agent added thereto;

covering the surface of the microelectronic device with the electroplating solution;

drawing a vacuum on the electroplating solution;

venting the vacuum to atmosphere; and repeating the steps of drawing a vacuum and venting the vacuum to atmosphere, in sequence, a plurality of times.

10. The method of claim 9, wherein the step of providing an article includes the step of providing an article having a via with a diameter of from about 10 to about 30 micrometers.

* * * * *